US008709687B2

(12) United States Patent
Van Der Schaar et al.

(10) Patent No.: US 8,709,687 B2
(45) Date of Patent: Apr. 29, 2014

(54) SUBSTRATE AND PATTERNING DEVICE FOR USE IN METROLOGY, METROLOGY METHOD AND DEVICE MANUFACTURING METHOD

(75) Inventors: Maurits Van Der Schaar, Eindhoven (NL); Patrick Warnaar, Tilburg (NL); Kaustuve Bhattacharyya, Veldhoven (NL); Hendrik Jan Hidde Smilde, Veldhoven (NL); Michael Kubis, Düsseldorf (DE)

(73) Assignee: ASML Netherlands B.V., Veldhoven (NL)

( * ) Notice: Subject to any disclaimer, the term of this patent is extended or adjusted under 35 U.S.C. 154(b) by 59 days.

(21) Appl. No.: 13/401,882

(22) Filed: Feb. 22, 2012

(65) Prior Publication Data

US 2013/0059240 A1    Mar. 7, 2013

Related U.S. Application Data

(60) Provisional application No. 61/467,080, filed on Mar. 24, 2011.

(51) Int. Cl.
*G03F 9/00*    (2006.01)

(52) U.S. Cl.
USPC ............................. 430/22; 430/30; 356/400

(58) Field of Classification Search
USPC ...................................... 430/22, 30; 356/400
See application file for complete search history.

(56) References Cited

U.S. PATENT DOCUMENTS

| | | | |
|---|---|---|---|
| 7,608,468 | B1 | 10/2009 | Ghinovker et al. |
| 2003/0223630 | A1 | 12/2003 | Adel et al. |
| 2006/0033921 | A1 | 2/2006 | Den Boef et al. |
| 2006/0066855 | A1 | 3/2006 | Boef et al. |
| 2009/0027691 | A1* | 1/2009 | Van Der Schaar et al. ... 356/612 |
| 2010/0201963 | A1 | 8/2010 | Cramer et al. |
| 2010/0328655 | A1 | 12/2010 | Den Boef |
| 2011/0042791 | A1 | 2/2011 | Schulze et al. |

FOREIGN PATENT DOCUMENTS

| | | |
|---|---|---|
| WO | WO 2009/078708 A1 | 6/2009 |
| WO | WO 2009/106279 A1 | 9/2009 |
| WO | WO 2010/020331 A1 | 2/2010 |
| WO | WO 2011/012624 A1 | 2/2011 |

OTHER PUBLICATIONS

International Search Report directed to related International Patent Application No. PCT/EP2012/052862, mailed Aug. 14, 2012; 4 pages.
Girol-Gunia, S., et al., "Using in-chip overlay metrology," Proceedings of SPIE, Metrology, Inspection, and Process Control for Microlithography XXII, vol. 6922, 2008; pp. 69220N-1 to 69220N-12.
Hsueh, B.Y., et al., "High Order Correction and Sampling Strategy for 45nm Immersion Lithography Overlay Control," Proceedings of SPIE, Metrology, Inspection, and Process Control for Microlithography XXII, vol. 6922, 2008: pp. 69222Q-1 to 69222Q-8.
Ku, Y.S., et al., "In-chip overlay metrology for 45nm processes," Proceedings of SPIE, Modeling Aspects in Optical Metrology, vol. 6617, 2007; pp. 66170X-1 to 66170X-12.
Ku, Y.S., et al., "In-chip overlay metrology for 45nm and 55nm processes," Proceedings of SPIE, Metrology, Inspection, and Process Control for Microlithography XXI, vol. 6518, 2007; pp. 65182V-1 to 65182V-12.
Schulz, B., et al., "Meeting overlay requirements for future technology nodes with in-die overlay metrology," Proceedings of SPIE, Metrology, Inspection, and Process Control for Microlithography XXI, vol. 6518, 2007; pp. 65180E-1 to 65180E-11.

* cited by examiner

*Primary Examiner* — Christopher Young
(74) *Attorney, Agent, or Firm* — Sterne, Kessler, Goldstein & Fox PL.L.C.

(57) ABSTRACT

A pattern from a patterning device is applied to a substrate by a lithographic apparatus. The applied pattern includes product features and metrology targets. The metrology targets include large targets and small targets which are for measuring overlay. Some of the smaller targets are distributed at locations between the larger targets, while other small targets are placed at the same locations as a large target. By comparing values measured using a small target and large target at the same location, parameter values measured using all the small targets can be corrected for better accuracy. The large targets can be located primarily within scribe lanes while the small targets are distributed within product areas.

6 Claims, 5 Drawing Sheets

SUBSTRATE AND PATTERNING DEVICE FOR USE IN METROLOGY, METROLOGY METHOD AND DEVICE MANUFACTURING METHOD

CROSS REFERENCE TO RELATED APPLICATIONS

This application claims the benefit under 35 U.S.C. §119 (e) to U.S. Provisional Application 61/467,080, filed Mar. 24, 2011, which is incorporated by reference herein in its entirety.

BACKGROUND

1. Field of the Invention

The present invention relates to methods and apparatus for metrology usable, for example, in the manufacture of devices by lithographic techniques and to methods of manufacturing devices using lithographic techniques. Methods of measuring overlay are described, as a particular application of such metrology.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. By placing the target in amongst the product features, it is hoped to increase accuracy of measurement because the smaller target is affected by process variations in a more similar way to the product features and because less interpolation may be needed to determine the effect of a process variation at the actual feature site. Unfortunately, the nature of the small targets and the techniques required to measure them tends to limit the accuracy with which overlay and other parameters can be made, making it lower than can be achieved with conventional, larger targets. Therefore the benefit of measuring overlay or other parameters within product areas is not fully realized, because the accuracy of the small target measurements themselves is impaired.

SUMMARY

Therefore, what is needed is a system and method for present invention using small target metrology to measure parameters for example at locations within product areas on a semiconductor substrate, with an accuracy similar to that associated with larger targets.

According to a first aspect of the present invention, there is provided a substrate having one or more product features formed on it and distributed over the substrate, and a plurality of metrology targets adapted for use in measuring a parameter of performance of a lithographic process by which the product patterns have been applied to the substrate. The metrology targets include a first set of targets distributed at locations across the substrate and a second set of targets which are for measuring the same parameter but which are smaller than the first set. The second set of targets including a first subset distributed at locations between the first set of targets, and a second subset distributed substantially at the same locations as the targets of the first set.

The parameter may be overlay, and each target may be an overlay grating formed in two patterned layers on the substrate. In some embodiments of the present invention, the product features are arranged in product areas separated by scribe-lanes, and the targets of the first set are located primarily within the scribe-lanes, while the targets of the second set are distributed within product areas. The targets of the second set may be more numerous than those of the first set.

The expression "product features" in the present disclosure is not intended to be limited to product features in their final form in a functional, manufactured device, but includes precursors of such features, for example portions of photo-sensitive resist material that have been exposed to record a pattern, prior to development, etching etc. that will turn the pattern into physical product features. In measuring overlay between two layers, for example, physical product features that have been etched into an underlying layer may be compared with product features that exist as a latent image or in a developed form in a resist layer, prior to forming the functional features that will be present in a finished semiconductor device or other product being manufactured.

The present invention further provides a method of measuring a parameter of performance of a lithographic process by which product features have been applied to a substrate, the method comprising simultaneously with applying the product features to the substrate, applying a plurality of metrology targets, the metrology targets including a first set of targets distributed at locations across the substrate and a second set of targets which are for measuring the same parameter but which are smaller than the first set, the second set of targets including a first subset distributed at locations between the first set of targets, and a second subset distributed substantially at the same locations as the targets of the first set, illuminating the targets and detecting radiation diffracted or reflected by the targets and processing the radiation to determine values for the parameter at the locations of a plurality of the targets in each set, correcting parameter values measured using the first subset of the second set of targets based on a comparison between values measured at one or more locations using a target of the second subset and a target of the first set.

The present invention further provides a device manufacturing method comprising transferring a functional device pattern from a patterning device onto a substrate using a lithographic process while simultaneously transferring a metrology target pattern to the substrate, measuring the metrology target pattern to determine a value for one or more parameters of the lithographic process, and applying a correction in subsequent operations of the lithographic process in accordance with the results of the metrology, wherein the metrology target pattern comprises a first set of targets distributed at locations across the substrate and a second set of targets which are for measuring the same parameter but which are smaller than the first set, the second set of targets including a first subset distributed at locations between the first set of targets, and a second subset distributed substantially at the same locations as the targets of the first set.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
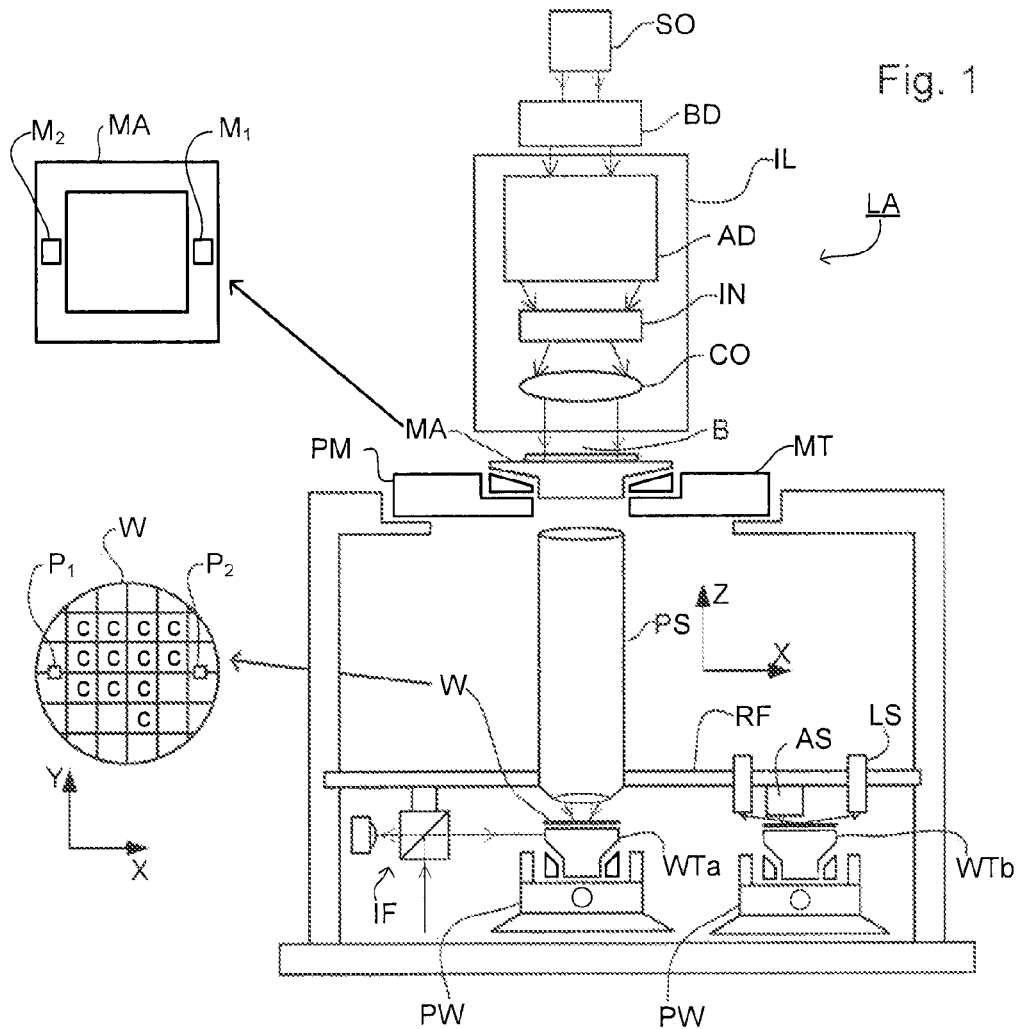
FIG. 1 depicts a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus illustrated for the sake of example is of a type having two (dual stage) or more substrate tables WTa and WTb (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor 1F (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa or WTb may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations, relative to reference frame RF.

Figure 2:
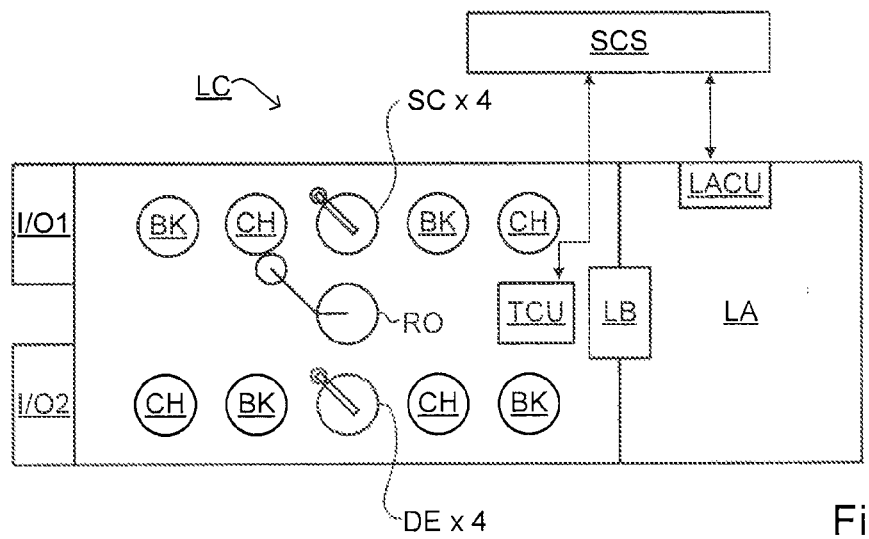
FIG. 2 depicts a lithographic cell or cluster according to an embodiment of the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3A:
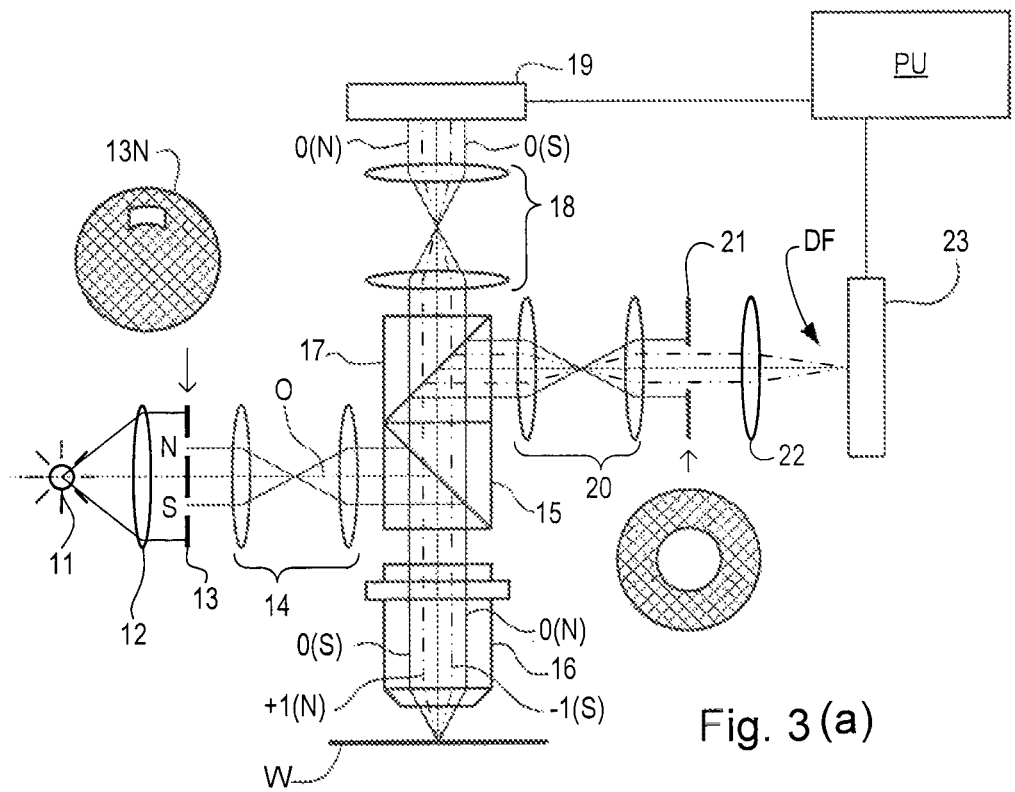
FIGS. 3A-3C show a schematic diagram of a dark field scatterometer for use in measuring targets according to embodiments of the present invention, a detail of diffraction spectrum of a target grating for a given direction of illumination and a set of four illumination apertures useful for providing four illumination modes in using the scatterometer for diffraction based overlay measurements.

A metrology apparatus in the form of a scatterometer useful in an embodiment of the present invention, is shown in FIG. 3A. A target grating T and diffracted rays are illustrated in more detail in FIG. 3B. The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. Depending on the type of measurement being undertaken, different forms of aperture may be used. Examples might be a spot or annular aperture centered on the optical axis of the illumination system formed by lenses 12, 14 and 16.

Figure 3B:
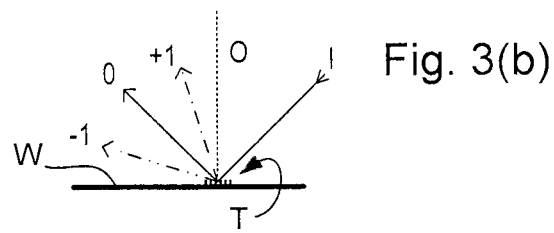
Figure 3C:
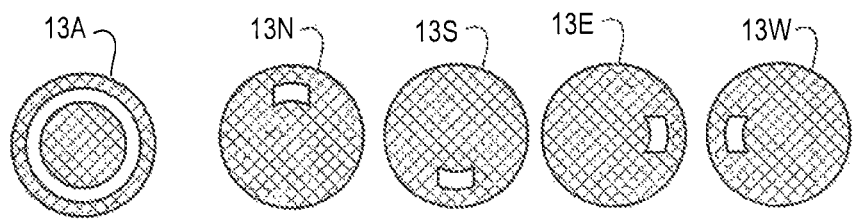

Using the annular aperture 13A, illustrated in FIG. 3C, the measurement beam is incident on substrate W in a cone of angles not encompassing the normal to the substrate. The illumination system thereby forms an off-axis illumination mode with circular symmetry. Other modes of illumination are possible by using different apertures, as will be described. For the purpose of the measurements described herein, non-annular off-axis illumination modes are particularly suitable, such as the aperture 13N illustrated in FIGS. 3A and C. This has an aperture in one or two quadrants of the conjugate pupil plan only, at an off-axis position. The rest of the pupil plane is desirably dark as any unnecessary light outside the desired illumination mode will interfere with the desired measurement signals.

As shown in FIG. 3B, target grating T is placed with substrate W normal to the optical axis O of objective lens 16. A ray of illumination I impinging on grating T from an angle off the axis O gives rise to a zeroth order ray (solid line 0) and two first order rays (dot-chain line +1 and double dot-chain line −1). It should be remembered that, these rays are just one of many parallel rays covering the area of the substrate including metrology target grating T and possibly (with an overfilled small target grating) other features. Since the annular aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

At least the 0 and +1 orders diffracted by the target on substrate W are collected by objective lens 16 and directed back through beam splitter 15. Remembering that, when using the illustrated annular aperture plate 13, incident rays I impinge on the target from a cone of directions rotationally symmetric about axis O, first order rays −1 from the opposite side of the cone will also enter the objective lens 16, even if the ray −1 shown in FIG. 3B would be outside the aperture of objective lens 16. Returning to FIG. 3A, this is illustrated by designating diametrically opposite portions of the annular aperture as north (N) and south (S). The +1 diffracted rays from the north portion of the cone of illumination, which are labeled +1(N), enter the objective lens 16, and so do the −1 diffracted rays from the south portion of the cone (labeled −1(S)).

A second beam splitter 17 divides the diffracted beams into two measurement branches. In a first measurement branch, optical system 18 forms a diffraction spectrum (pupil plane image) of the target on first sensor 19 (e.g., a CCD or CMOS sensor) using the zeroth and first order diffractive beams. Each diffraction order hits a different point on the sensor, so that image processing can compare and contrast orders. The pupil plane image captured by sensor 19 can be used for conventional angle-resolved scatterometry on a range of different target types. For the present description, the purpose of the pupil image branch and sensor 19 is for measurement of overlay in large targets as part of a method according to the present invention.

In the second measurement branch, optical system 20, 22 forms an image of the target on the substrate W on sensor 23 (e.g., a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the first order beam. This is the so-called dark field image, equivalent to dark field microscopy. In embodiments of the present invention, this branch is used for dark field, image-based metrology on small, overfilled targets. The images captured by sensors 19 and 23 are output to image processor and controller PU, the function of which will depend on the particular type of measurements being performed.

The particular forms of aperture plate 13 and field stop 21 shown in FIG. 3 are purely examples. In another embodiment of the present invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 3) can be used in measurements, instead of or in addition to the first order beams.

In yet other embodiments, apertures in stops 13 and/or 21 are not circular or annular, but admit light at certain angles around the optical axis only. Bipolar illumination can be used to form dark field images of gratings aligned with the X and Y axes of substrate W. Depending on the layout of the apparatus, for example, illumination from north and south poles may be used to measure a grating with lines parallel to the X axis, while illumination with east and west poles is used to measure a grating with lines parallel to the Y axis.

In order to make the illumination adaptable to these different types of measurement, the aperture plate 13 may contain a number of aperture patterns on a disc which rotates to bring a desired pattern into place. Alternatively or in addition, a set of plates 13 could be provided and swapped, to achieve the same effect. A programmable illumination device such as a deformable mirror array can be used also. As just explained in relation to aperture plate 13, the selection of diffraction orders for imaging can be achieved by altering the field stop 21, or by substituting a field stop having a different pattern, or by replacing the fixed field stop with a programmable spatial light modulator. While the optical system used for imaging in the present examples has a wide entrance pupil which is restricted by the field stop 21, in other embodiments or applications the entrance pupil size of the imaging system itself may be small enough to restrict to the desired order, and thus serve also as the field stop.

FIG. 3C shows a set of aperture plates 13N, 13S, 13E, 13W which can be used to make asymmetry measurements of small target gratings, for the dark field overlay measurement method disclosed in our prior international patent application PCT/EP2010/060894 (applicant's ref P3481.010), incorporated by reference herein in its entirety. Using aperture plate 13N, for example, illumination is from north only, and only the +1 order will pass through field stop 21 to be imaged on sensor 23. By exchanging the aperture plate for plate 13S, then the −1 order can be imaged separately, allowing asymmetries in the target grating T to be detected and analyzed. The same principle applies for measurement of an orthogonal grating and illuminating from east and west using the aperture plates 13E and 13W. The aperture plates 13N to 13W can be separately formed and interchanged, or they may be a single aperture plate which can be rotated by 90, 180 or 270 degrees. As mentioned already, the off-axis apertures illustrated in FIG. 3C could be provided in field stop 21 instead of in illumination aperture plate 13. In that case, the illumination could be on axis.

Different forms and applications of scatterometer are described for example in US patent applications U.S. Pub. App. Nos. 2006/033921A and US 2010/201963A, which are incorporated by reference herein in their entireties. Application of such scatterometers to the measurement of overlay in composite gratings is described for example in US 2006/0066855A, which is incorporated by reference herein in its entirety. The entire content of these documents is hereby incorporated by reference herein. In order to reduce the size of the targets, e.g., to 10 µm by 10 µm or less, e.g., so they can be positioned in amongst product features, rather than in the scribe lane, so-called "small target" metrology has been proposed, in which the grating is made smaller than the measurement spot (i.e., the grating is overfilled). Typically small targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279, which are incorporated by reference herein in their entirety. Diffraction based overlay measurement by dark field imaging is described in US patent application US 2010/328655A. These documents are hereby incorporated by reference herein in their entirety. Other types of target and measurement, including image-based metrology are also available.

As an alternative, the substrate is rotated by 180°, rather than rotating the illumination angle. This eliminates potential sources of error, and the expense of throughput.

Figure 4:
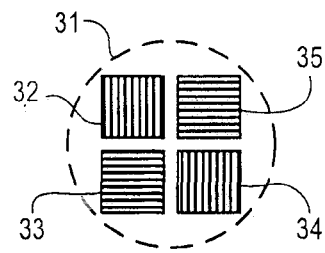
FIG. 4 depicts a known form of small target and an outline of a measurement spot on a substrate.

FIG. 4 depicts a composite target formed on a substrate according to known practice. The composite target comprises four small gratings 32 to 35 positioned closely together so that they will all be within the measurement spot 31 formed by the illumination beam of the metrology apparatus and thus are all simultaneously illuminated and simultaneously imaged on sensors 19 (pupil plane image) and 23 (substrate plane image). In an example dedicated to overlay measurement, gratings 32 to 35 are themselves composite gratings formed by overlying gratings that are patterned in different layers of the semi-conductor device formed on substrate W. Gratings 32 to 35 are differently biased in order to facilitate measurement of overlay between the layers in which the different parts of the composite gratings are formed. In one example, gratings 32 to 35 have biases of +d, −d, +3d, −3d respectively. This means that one of the gratings has its components arranged so that if they were both printed exactly at their nominal locations one of the components would be offset relative to the other by a distance d. A second grating has its components arranged so that if perfectly printed there would be an offset of d but in the opposite direction to the first grating and so on. While four gratings are illustrated, a practical embodiment might require a larger matrix to obtain the desired accuracy.

In addition to having different offsets among the gratings 32-35, the gratings may have different orientations, for example half of them being oriented in the X direction and the other half in the Y direction. For example, X and Y gratings are schematically indicated in the target shown in FIG. 4, the X-direction gratings 32, 34 may have offsets +d and −d respectively, while the Y-direction gratings 33, 35 also have offsets of +d an d.

FIG. 5 shows examples of images that may be formed on and detected by the sensor 23, using the target of FIG. 4 in the apparatus of FIG. 3, using the aperture plates 13N and the like from FIG. 3C. While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in this image. Image processor and controller PU processes these images to identify the separate images 42 to 45 of gratings 32 to 35. This can be done by pattern matching techniques, so that the images do not have to be aligned very precisely at a specific location within the sensor frame. Reducing the need for accurate alignment in this way greatly improves throughput of the measuring apparatus as a whole.

Once the separate images of the gratings have been identified, the intensities of those individual images can be measured, e.g., by averaging or summing selected pixel intensity values within the identified areas Intensities and/or other properties of the images can be compared with one another. Using different apertures at 13 and 21, different measurements can be taken. These results can be combined to measure different parameters of the lithographic process. Overlay performance is an important example of such a parameter.

Figure 5A:
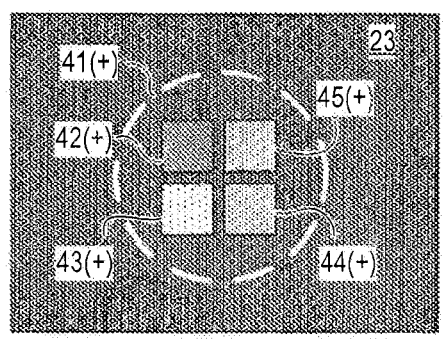
FIGS. 5A and 5B depict images of the targets of FIG. 4 obtained in the scatterometer of FIG. 3 in $-1^{st}$ order and $+1^{st}$ order diffraction.
Figure 5B:
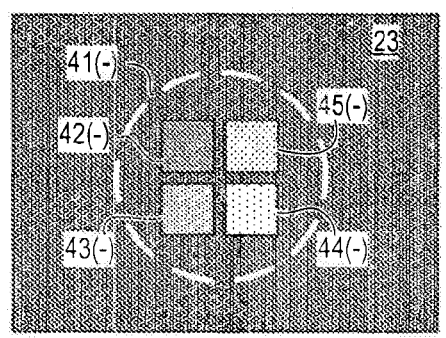

Using for example the method described in application PCT/EP2010/060894, which is incorporated by reference herein in its entirety, overlay error between the two layers containing the component gratings 32 to 35 is measured through asymmetry of the gratings, as revealed by comparing their intensities in the +1 order and −1 order dark field images. Using the metrology apparatus of FIG. 3 with an aperture plate 13 having only a single pole of illumination (e.g., north, using plate 13N), an image of the gratings 32 to 35 is obtained using only one of the first order diffracted beams (say +1). Then, either the substrate W or the aperture plate 13 is rotated by 180° so that a second image of the gratings using the other first order diffracted beam can be obtained. For example, the aperture plate may be changed from 13N to 13S while keeping the optical system otherwise the same. Consequently the −1(S) diffracted radiation is captured in the second image. FIG. 5A shows images 42(+) to 45(+) of the gratings 32-35, using only the +1 order diffracted radiation. FIG. 5B shows images 42(−) to 45(−) of the same gratings, using only the −1 order diffracted radiation. In embodiments where the substrate is rotated between measurements, the positions of the grating images will be rotated also. The images A and B in FIG. 5 are generally similar, but with different intensities of the grating images 42 to 45. Note that by including only half of the first order diffracted radiation in each image, the 'images' referred to here are not conventional dark field images that would be produced using the aperture illustrated in FIG. 3A. The individual grating lines will not be resolved. Each grating will be represented simply by an area of a certain grey level. The overlay can then be determined by the image processor and controller PU by comparing the intensity values obtained for +1 and −1 orders, and from knowledge of the overlay biases of the gratings 32 to 35. As described in the prior application, X and Y direction measurements can be combined in one illumination step by providing a first an aperture plate with, say, apertures at north and east portions, while a second aperture plate is provided with apertures at south and west.

If the gratings are particularly close together on the substrate, it is possible that the optical filtering it the second measurement branch may cause cross talk between signals. In that event, the central opening in the spatial filter formed by field stop 21 should be made as large as possible while still blocking the zeroth order.

It will be appreciated that the target arrays provided in this embodiment of the present invention can be located in the scribe lane or within product areas. By including multiple targets within an area illuminated by the measurement spot 31 and imaged on sensor 23, several advantages may accrue. For example, throughput is increased by acquisition of multiple target images in one exposure, less area on the substrate need be dedicated to metrology targets and accuracy of overlay measurements can be improved, especially where there is a non-linear relationship between the intensities of the different first order diffraction beams and overlay.

Figure 6:
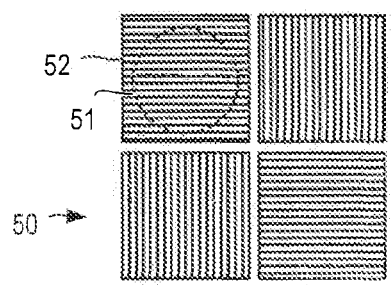
FIG. 6 depicts a known form (large) target and an outline of a measurement support on a substrate.

FIG. 6 shows an example of a larger overlay metrology target 50, which is intended for measurement using the pupil plane image branch (sensor 19) of the scatterometer, but can also be measured using the image-based dark field branch (sensor 23). Target 50 again comprises a number of gratings, of which one is labeled 52. The dashed circle 51 indicates an illumination spot, which may be the same spot as is labeled 31 in FIG. 4. From this comparison, we see that the gratings 52 etc are large enough to more than fill the illumination spot, so that there is no extraneous signal from product features, neighboring gratings etc. It is not essential that the large targets are underfilled, however.

Figure 7A:
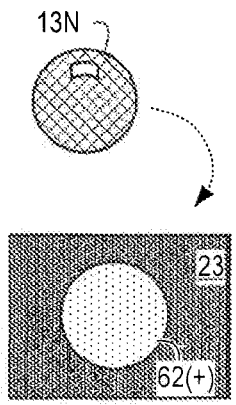
FIGS. 7A-7C depict pupil images of the target of FIG. 6 obtained in the scatterometer of FIG. 3 in $-1^{st}$ order $+1^{st}$ order diffraction.
Figure 7B:
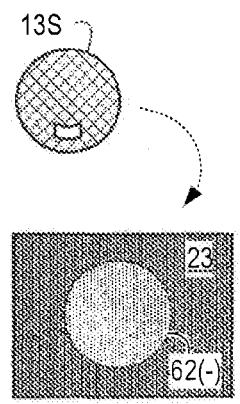

FIG. 7 at A and B illustrates images recorded by the dark field image sensor 23, when illuminating the grating 52 with different illumination modes, so that the image at A records the pupil image 62 (+) using +1 order radiation diffracted by target 52, and image B records pupil image 62 (−) using −1 order diffracted radiation. As before, the order of diffracted radiation which is captured by the pupil image sensor can be selected by selecting different aperture plates, 13N, 13S etc. Also as before, the different diffraction orders can be selected by using a single illumination mode, but rotating the substrate 180° between measurements. Again, each image A and B records a slightly different intensity of radiation from the +1 and −1 orders. Comparison of these intensities allows a measure of asymmetry in the gratings, and hence, with appropriate targets, overlay error. Again, different gratings 52 etc within a large target may be provided with different biases in their overlay, so as to allow a qualitative estimate of overlay.

Figure 7C:
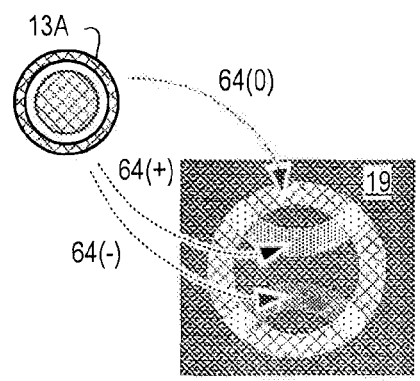

FIG. 7C illustrates an alternative method of measuring asymmetry, and hence overlay error, in grating 52, this time using the angle resolved scatter spectrum detected by pupil image sensor 19. For this purpose, multiple measurements could be taken using apertures such as 13N and 13S, or using a single aperture with different rotations of the substrate. In the example illustrated, however, a single angle resolved scatter spectrum is imaged in the pupil plane image sensor 19, using the annular aperture 13A. In this single image, one can see the zero order image (reflection) of the aperture labeled 64(0). Also within the pupil image on sensor 19 are portions 64(+) and 64(−), corresponding to the +1 and −1 orders of diffracted radiation. Provided that the performance of the optical system is uniform and/or corrected with any necessary calibrations, intensities of +1 and −1 order diffracted radiation from target grating 52 can be compared by comparing the intensity of these two portions of the pupil plane image measured by sensor 19. Asymmetry in these intensities carries information about asymmetry in the target, and hence overlay. As mentioned above, principles of diffraction-based overlay measurement are known from US patent application publication US 20060066855A and 2010/0328655A1.

Figure 8:
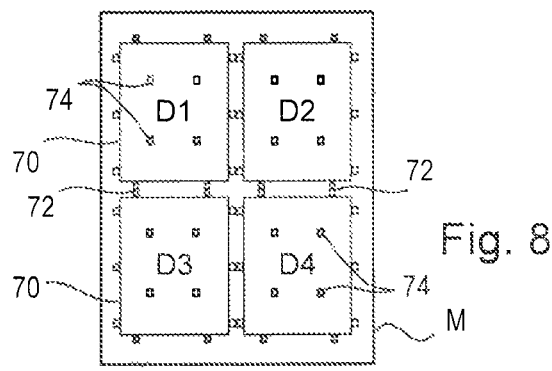
FIG. 8 illustrates general form of a patterning device having product areas, scribe lane areas and metrology targets in both the scribe lane and product areas.

FIG. 8 shows schematically the overall layout of a patterning device M. As mentioned already, the metrology targets 72 may be included in a scribe lane portion of the applied pattern, between functional device pattern areas 70. As is well known, patterning device M may contain a single device pattern, or an array of device patterns if the field of the lithographic apparatus is large enough to accommodate them. The example in FIG. 8A shows four device areas labeled D1 to D4. Scribe lane targets 72 such as targets 800 and 800' are placed adjacent these device pattern areas and between them. On the finished substrate, such as a semiconductor device, the substrate W will be diced into individual devices by cutting along these scribe lanes, so that the presence of the targets does not reduce the area available for functional device patterns. Where targets are small in comparison with conventional metrology targets, they may also be deployed within the device area, to allow closer monitoring of lithography and process performance across the substrate. Some targets 74 of this type are shown in device area D1. While FIG. 8 shows the patterning device M, the same pattern is reproduced on the substrate W after the lithographic process, and consequently this the description applies to the substrate W as well as the patterning device.

Both the large target method of FIGS. 6 and 7, and the small target method of FIGS. 4 and 5 are separately known for the measurement of overlay and/or other parameters in a lithography environment. Although, for example, the dark-field method with small targets is designed for overlay measurements within the product areas 70, where the available 'real estate' is very limited, it is expected to be less accurate and precise than the diffraction based overlay method with large targets. This is due to a combination of factors, including the small size of the target area, the method of measurement and, in particular, a higher dependence on the overall lithography process than the diffraction-based overlay with large targets. With image-based overlay metrology instruments, not using dark-field imaging, similar problems will arise as the target size shrinks. On the other hand, the larger targets can produce more accurate overlay measurements with less process dependency, but occupy too great an area to be used with a high density inside the product area 70 of a commercial device manufacturing process. In order to improve the performance and density of overlay measurements without sacrificing in-product real-estate, the scribe-lane marks 72 and in-product marks 74 of FIG. 8 are based on a hybrid of the large target and small target systems, as will now be described.

Figure 9:
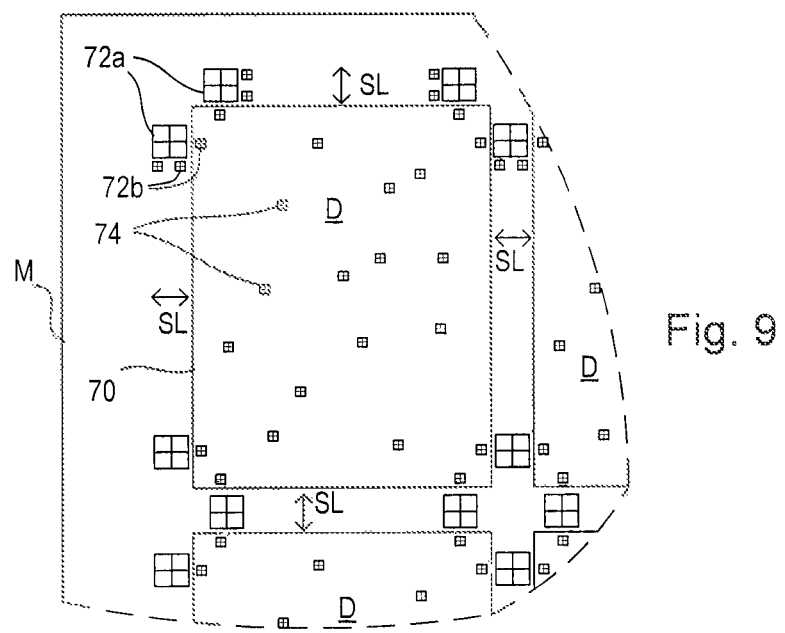
FIG. 9 illustrates more detail of an embodiment of the patterning device of FIG. 6, according to the present invention.

FIG. 9 shows in more detail one of the product areas 70 on the patterning device M, showing the targets 72 and 74 in more detail. The same pattern is produced and repeated at each field on the substrate. Product areas are labeled D and scribe-line areas are labeled SL. In the device areas 70, small targets 74 are spread with a desired density at different locations among the product features. Theses targets have, for example, the form illustrated in FIG. 4, and can be measured using the dark-field imaging sensor 23 of the scatterometer of FIG. 3. In the scribe-lane areas SL, large targets 72*a*, for example of the type illustrated in FIG. 6, are provided in a conventional manner. Beside each of the large targets of 72*a* is provided one or more small targets 72*b*, however, which may be in the scribe-lane areas SL or just inside the product area 70. Where each target comprises a group of two or more individual gratings, the individual gratings of the small and large targets could be positioned among the gratings of the large target, rather than being wholly separate. The small targets 72*b* are identical in form to the small targets 74 which are distributed over the product area 70. With this combination of targets, the large scribe-lane targets 72*a* can be used to measure a lower order of model for overlay with high accuracy, while the small in-product targets 74 can be measured with high density, and modeled as a perturbation of the lower order model. Since the regular targets 72*a* are accompanied by smaller targets 72*b* close by, inaccuracies caused by, for example, process dependency in the measured overlay using small targets can be known and compensated.

Figure 10:
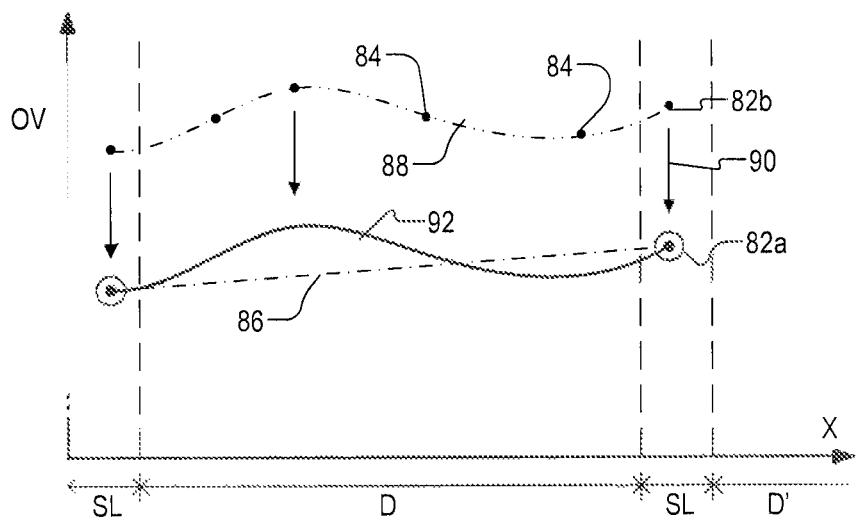
FIG. 10 illustrates the principle of combining measurement results obtained from large and small targets formed on a substrate exposed using the patterning device of FIG. 9 to obtain more accurate measurements, in an embodiment of the present invention.

FIG. 10 illustrates graphically the novel, hybrid measurement concept described above. The horizontal axis X represents one dimension across the substrate. The product area D and scribe-lane areas SL are delimited on this axis. The vertical axis represents measured overlay values OVL. Two circled points labeled 82*a* are plotted to show overlay values measured the large targets 72*a*. Overlay values measured using the small targets 72*b* adjacent to the large targets are labeled 82*b*, and overlay values measured across the product area using the small targets 74 are labeled 84. Applying, for the sake of example, a simple linear model to the overlay across this product area, a profile curve 86 in single dot-dash line can be plotted between the points 82a. This curve or can be regarded as having a high accuracy where the overlay is sampled at points 82a, but has no fine detail in the product area in between. Another profile curve 88 (double dot-dash line) is plotted from the small target measurements 82b and 84. This higher order profile obviously contains far more detail in the X direction, but the its measured overlay value is known to be subject to errors due to process dependency and limitations of the measuring instrument. Knowing that the targets 72b and 72a are positioned substantially at the same point on the substrate, however, an assumption can be made that the true overlay value represented by point 82b on the graph is more accurately represented by the value of point 82a. An offset 90 can therefore be calculated, and applied to all the points 84 so that the detail from the curve 88 can be applied as a perturbation of the straight line 86, to obtain a curve 92, which has both absolute accuracy and detailed structure across the product area.

While the simplified illustration of FIG. 10 shows only one dimension, the skilled reader will appreciate that the measurements and models extend in both the X and Y directions. Overlay in X and Y directions can also be separately modeled across this two-dimensional area. Similarly, while the curve 86 is a linear model between just two sample points, a real substrate will have a number of measurements 82a which can be joined with a higher order model, again in two dimensions. Nevertheless, the addition of perturbations from the curve 88 allows yet higher orders, particularly showing in-product variations, to be added to the model. The overlay values can be analyzed in a number of ways. For example, the processor can separate out perturbations which are common to all fields of the substrate from those which vary across the substrate as a whole. Thus, an intra-field overlay fingerprint can be separated from an inter-field overlay fingerprint.

The lower order model based on the large targets can, for example, be a six-parameter model, while the smaller targets are measured and modeled as a perturbation of one or more of the parameters, with third and higher order terms. In one embodiment, the six parameters of overlay are: X, Y translation; symmetrical and asymmetric magnification; symmetric and asymmetric rotation. The lower order model contribution is assumed to be constant per image field, and is only linearly interpolated within the field, as shown in FIG. 10.

Figure 11:
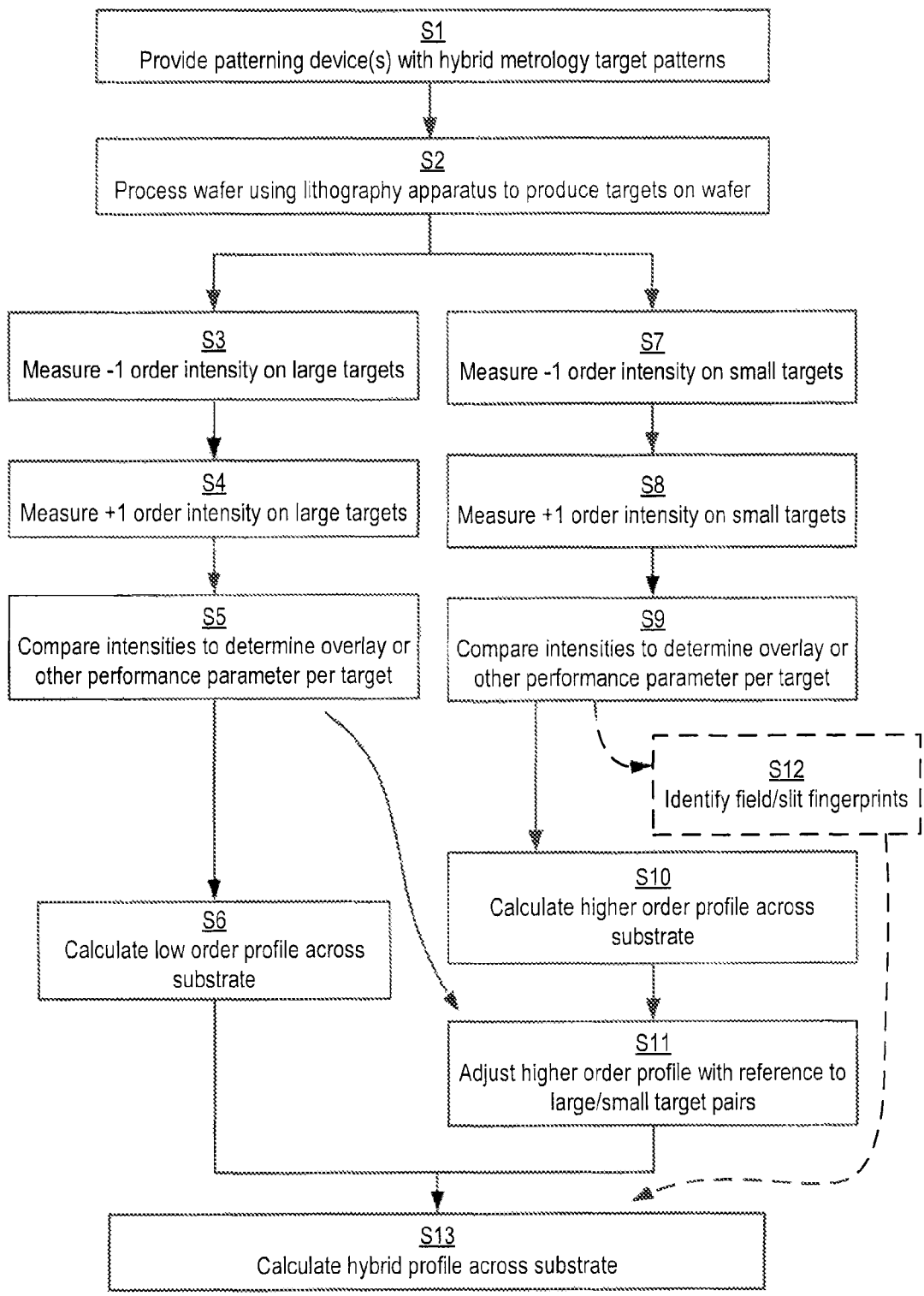
FIG. 11 is a flow chart illustrating a metrology method according to an embodiment of the present invention.

FIG. 11 is a flowchart showing the process for creating and measuring a parameter of a lithographic process, such as overlay. The process uses the combination of large targets relatively sparsely distributed across the substrate, and smaller targets that are more densely distributed. At step S1 a patterning device (reticle) or set of patterning devices is provided with target patterns such as those illustrated in FIGS. 8 and 9 distributed around and within product pattern areas 70. Where the target is for measuring overlay, patterns for making the overlay metrology target will be included in at least two different reticles, which define patterns in different layers of the semiconductor or other product. Where the patterning device is replaced by a programmable patterning device, the patterns are provided in data form, but the process is essentially the same. At S2, the metrology targets and product features are formed on the field areas of a substrate using a lithographic process. Of course a series of substrates will be patterned in practice, repeating step S2 and subsequent steps. The following steps are illustrated and described in a certain order, but can be performed in various orders without departing from the principles of the process.

The patterned substrate is then loaded into a metrology apparatus such as the scatterometer of FIG. 3. Steps S3 to S5 relate to measurement of overlay on the large targets 72a. Using the FIG. 3 scatterometer, purely as an example, these measurements would be done with the pupil image branch and sensor 19, as illustrated in FIGS. 6 and 7. At S3 and S4 the intensity of each target (and each grating within the target) is measured using only −1 order and only +1 diffracted radiation, respectively. At S5 the intensities are compared to derive a measure of asymmetry, and hence overlay, in each target 72a. At S6 the measured large target overlay values are combined into a low-order profile of overlay across the substrate, represented by the curve 86 in FIG. 10.

At S7 and S8, the small targets 72b and 74 across the substrate are measured with −1 order and +1 order diffracted radiation respectively. Using the FIG. 3 scatterometer, purely as an example, these measurements would be done with the dark field imaging branch and sensor 23, as illustrated in FIGS. 4 and 5. For each target and each grating within the target, the two measured intensities are compared at step S9 to obtain an overlay measurement for each small target. At S10, these can be combined to define a higher-order profile of overlay across the substrate, similar to curve 88 in FIG. 10.

At S11, the low order and higher order profiles from steps S6 and S11 are merged, using the knowledge that small targets 72b are adjacent to large targets 72a, to produce a hybrid profile (i.e., curve 92 in FIG. 10). The manner in which the data from the two types of target are combined is not critical, and they may in fact be stored separately but with cross-references and adjustments made, when they are used. The principle is that the parameter (overlay for example) measured using the small targets can be corrected by reference to an offset observed between the small and large targets, which are adjacent one another.

As mentioned above, the profile of overlay and other parameters does not need to be expressed entirely as a variation across the substrate. It can be expressed for example as an intrafield profile that is common to all fields (each instance of patterning using the patterning device M at a different location on the substrate W) and a lower order, interfield, variation onto which the intrafield variation is repeatedly superimposed.

Assuming that the profile of overlay errors does indeed have a strong intrafield component that is substantially the same for every field, a shortened measurement process can be implemented, as illustrated by the step S12 in broken lines. In this modified embodiment of the process, the small targets 72b, 74 are all measured only for a few representative fields, sufficient to determine and record the intrafield profile and the offset 90. The intrafield variations can then be superimposed on the lower order interfield profile for all fields of the substrate, without measuring all the small targets across the substrate. Of course this embodiment assumes that the intrafield profile is sufficiently repeating, which will need to be verified by experiment for each process. The benefit is that the cost in time and measurement throughput is not so great as in a process where all the small targets are measured. Similarly, the correction to be applied between small and large target measurements may be constant across the substrate, and therefore predictable from a few comparisons only. Alternatively, experiment may reveal that the correction is quite variable, and should itself be modeled as a parameter variable from field to field.

The measurements achieved by the embodiments described above can be used purely for research purposes, or they may be used to control production of commercial devices. In the latter case, the process includes using the measured parameter profile to adjust parameters of the lithography process when performed on subsequent substrates.

While specific embodiments of the present invention have been described above, it will be appreciated that the present invention may be practiced otherwise than as described. In association with the physical grating structures of the novel targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of measuring a parameter of performance of a lithographic process by which product features have been applied to a substrate, the method comprising:
   simultaneously applying the product features and metrology targets to the substrate, the metrology targets including a first set of targets distributed at locations across the substrate and a second set of targets which are for measuring the same parameter but which are smaller than the first set, the second set of targets including a first subset distributed at locations between the first set of targets, and a second subset distributed substantially at the same locations as the targets of the first set;
   illuminating the targets and detecting radiation diffracted or reflected by the targets and processing the radiation to determine values for the parameter at the locations of a plurality of the targets in each set; and
   correcting parameter values measured using the first subset of the second set of targets based on a comparison between values measured at one or more locations using a target of the second subset and a target of the first set.

2. The method of claim 1, wherein the parameter is overlay and each target is formed by features in two patterned layers.

3. The method of claim 1, wherein the product features are arranged in product areas separated by scribe lanes, wherein the targets of the first set are located primarily within the scribe lanes while the targets of the second set are distributed within product areas.

4. The method of claim 1, wherein the targets are measured using a scatterometer having a first branch for performing angle-resolved scatterometry on the targets of the first set, and a second branch for performing dark field imaging on the targets of the second set, the targets of the second set being overfilled by an illumination spot of the scatterometer.

5. A device manufacturing method comprising:
   transferring a functional device pattern from a patterning device onto a substrate using a lithographic process while simultaneously transferring a metrology target pattern to the substrate;
   measuring the metrology target pattern to determine a value for one or more parameters of the lithographic process; and applying a correction in subsequent operations of the lithographic process in accordance with the results of the metrology, wherein the metrology target pattern comprises a first set of targets distributed at locations across the substrate and a second set of targets which are for measuring the same parameter but which are smaller than the first set, the second set of targets including a first subset distributed at locations between the first set of targets, and a second subset distributed substantially at the same locations as the targets of the first set.

6. The device manufacturing method of claim 5, wherein the functional device pattern comprises product features arranged in a plurality of product areas separated by scribe-lanes, and wherein the targets of the first set are located primarily within the scribe lanes while the targets of the second set are distributed within the product areas.

* * * * *